United States Patent [19]
McAllister et al.

[11] Patent Number: 6,073,223
[45] Date of Patent: Jun. 6, 2000

[54] MEMORY CONTROLLER AND METHOD FOR INTERMITTENTLY ACTIVATING AND IDLING A CLOCK SIGNAL FOR A SYNCHRONOUS MEMORY

[75] Inventors: Curtis R. McAllister, Sunnyvale, Calif.; Leith Johnson, Fort Collins, Colo.

[73] Assignee: Hewlett-Packard Company, Palo Alto, Calif.

[21] Appl. No.: 08/897,444

[22] Filed: Jul. 21, 1997

[51] Int. Cl.[7] .............................. G06F 13/00; G06F 1/08; G11C 7/00; G11C 11/407

[52] U.S. Cl. ......................... 711/167; 711/105; 713/323; 713/322; 713/502; 713/601; 365/227; 365/233

[58] Field of Search ...................................... 711/167, 104, 711/105; 365/227, 233; 713/320, 322, 323, 501, 502, 601

[56] References Cited

U.S. PATENT DOCUMENTS

| | | | |
|---|---|---|---|
| 5,337,285 | 8/1994 | Ware et al. | 365/227 |
| 5,623,453 | 4/1997 | Shinozaki | 365/233 |
| 5,742,194 | 4/1998 | Saeki | 327/298 |
| 5,848,014 | 12/1998 | Yukshing | 365/227 |
| 5,880,998 | 3/1999 | Tanimura et al. | 365/233 |

OTHER PUBLICATIONS

JEDEC Standard No. 21–C, p. 3.11.5–18, Release 4, (date unknown).

Product description of NEC μPD4564441 and NEC μPD45648841, pp. 9, 14, 18, available from NEC Corporation, (date unknown).

*Primary Examiner*—Glenn Gossage

[57] ABSTRACT

A memory controller and method for intermittently providing a clock signal to a synchronous memory. While no transactions are occurring, a clock signal is held in an idle state. Upon the start of a transaction with the synchronous memory, the clock signal is activated. When activated, the clock signal functions as a periodic timing reference clock. The clock signal remains active during the transaction. Upon completion of the transaction, the clock signal returns to the idle state. In one embodiment, a finite state machine utilizes a counter to control the process. Upon the start of a transaction with the synchronous memory a new count is loaded in a counter. The value for the new count depends, for example, on the number of commands necessary to complete the transaction. The counter, beginning with the new count, regularly increments. When the counter reaches a maximum value, the clock signal returns to the idle state. The clock signal remains in the idle state until the start of a second transaction with the synchronous memory. Then, again the clock signal is activated. The clock signal remains active during the second transaction. Upon completion of the second transaction, the clock signal is again returned to the idle state.

17 Claims, 4 Drawing Sheets

MEMORY CONTROLLER AND METHOD FOR INTERMITTENTLY ACTIVATING AND IDLING A CLOCK SIGNAL FOR A SYNCHRONOUS MEMORY

BACKGROUND

The present invention concerns access of memory systems and pertains particularly to controlling the clock for memory accesses to synchronous devices in order to minimize power usage.

Clocked synchronous memory, such as synchronous static random access memory (SSRAM) and synchronous dynamic random access memory (SDRAM) utilize a free running clock (that is, the clock continues to run without interruption as long as power is applied to the system) in order to perform transfers of data. Each clocked synchronous memory accepts a free running clock signal on a clock input.

In order to limit power consumption, some SDRAM designs include a separate clock enable (CKE) pin. See, for example, Joint Electron Device Engineering Counsel (JEDEC) Standard No. 21-C Page 3.11.5–18. When the CKE pin is not enabled, the SDRAM is placed in a low power mode. When the CKE pin is not enabled, the free running clock signal continues to run. While placing the SDRAM in a low power mode reduces the power consumption of the SDRAM, generally at least one clock cycle is required to return the SDRAM to normal operation after the SDRAM has been placed into the low power mode. This introduces a latency in operation of the SDRAM which has a negative impact on performance. In addition to the latency introduced by use of the CKE pin, there is also the disadvantage that such a system requires logic to control the CKE pin.

SUMMARY OF THE INVENTION

In accordance with the preferred embodiment of the present invention, a clock signal is provided to a synchronous memory. While no transactions are occurring, a clock signal is held in an idle state. Upon the start of a transaction with the synchronous memory, the clock signal is activated. When activated, the clock signal functions as a periodic timing reference clock. The clock signal remains active during the transaction. Upon completion of the transaction, the clock signal returns to the idle state.

For example, in a preferred embodiment of the present invention, a finite state machine utilizes a counter to control the process. Upon the start of a transaction with the synchronous memory, a new count is loaded in a counter. The value for the new count depends, for example, on the number of commands necessary to complete the transaction. The counter, beginning with the new count, regularly increments. When the counter reaches a maximum value, the clock signal returns to the idle state.

The clock signal remains in the idle state until the start of a second transaction with the synchronous memory. Then, again the clock signal is activated. The clock signal remains active during the second transaction. Upon completion of the second transaction, the clock signal is again returned to the idle state.

This intermittent operation of the clock signal has several advantages. For example, the clock driving circuitry within the memory controller will not consume as much power during the interim period between data transactions. Likewise, the synchronous memory will not consume as much power during the interim period between data transactions.

Another advantage of intermittent operation of the clock signal is that there is no latency between the beginning of a data transaction and the beginning of the clock signal. Further, the clock signal can be synchronized to the data transaction. That is, once a data transaction is ready to begin, the clock signal can immediately be activated. This is different than a system which uses a free running clock, where it is necessary to delay data transactions a sufficient amount to be in synchronization with the free running clock. For a free running clock, the average time that a transaction needs to wait in order to synchronize with the free running clock is proportional to the ratio of the memory bus clock period to the memory controller clock period.

For example, if the memory clock period is 45 nanoseconds (nS) and the memory controller clock period is 15 nanoseconds, then some transactions would wait 30 nanoseconds, some would wait 15 nanoseconds and some would wait 0 nanoseconds. Assuming uniform distribution, the average wait would be (0 nS+15 nS+30 nS)/3=15 nS. The present invention alleviates this transactional latency.

DESCRIPTION OF THE PREFERRED EMBODIMENT

Figure 1:
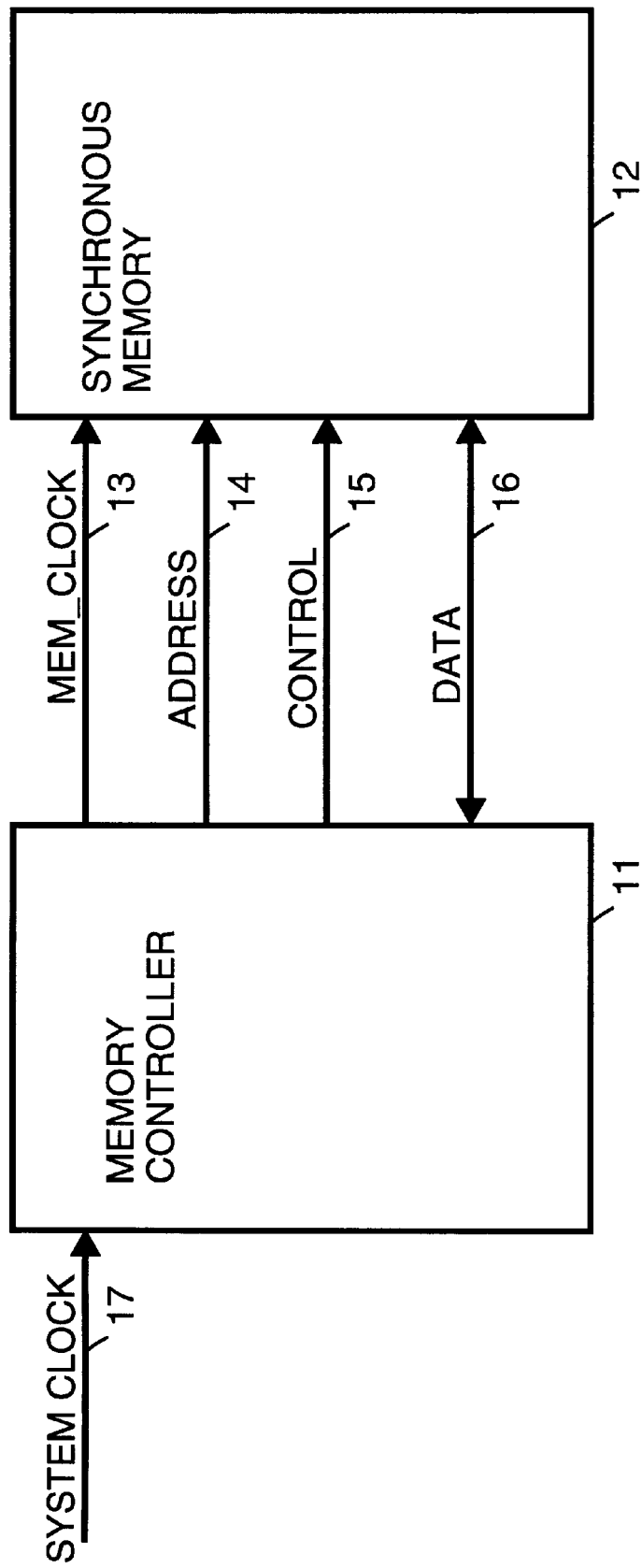
FIG. 1 is a simplified block diagram which illustrates connection of a memory controller and a synchronous memory in accordance with a preferred embodiment of the present invention.

FIG. 1 shows a simplified block diagram which illustrates connection of a memory controller 11 and a synchronous memory 12 in accordance with a preferred embodiment of the present invention. Synchronous memory 12 is, for example, a synchronous DRAM or a synchronous SRAM. Address lines 14 are used to select memory locations within synchronous memory 12. Data lines 16 are used to transfer data to and from synchronous memory 12. Control lines 15 are used to control data transfers to and from synchronous memory 12.

For example, control lines 15 include a row address strobe (RAS) line, a column address strobe (CAS) line a write enable (WE) line and a chip select (CS) line. Additionally, synchronous memory 12 may include a clock enable. If so, when operating in accordance with the preferred embodiment of the present invention, the clock enable for synchronous memory 12 is not used (i.e., synchronous memory 12 remains enabled).

Figure 2:
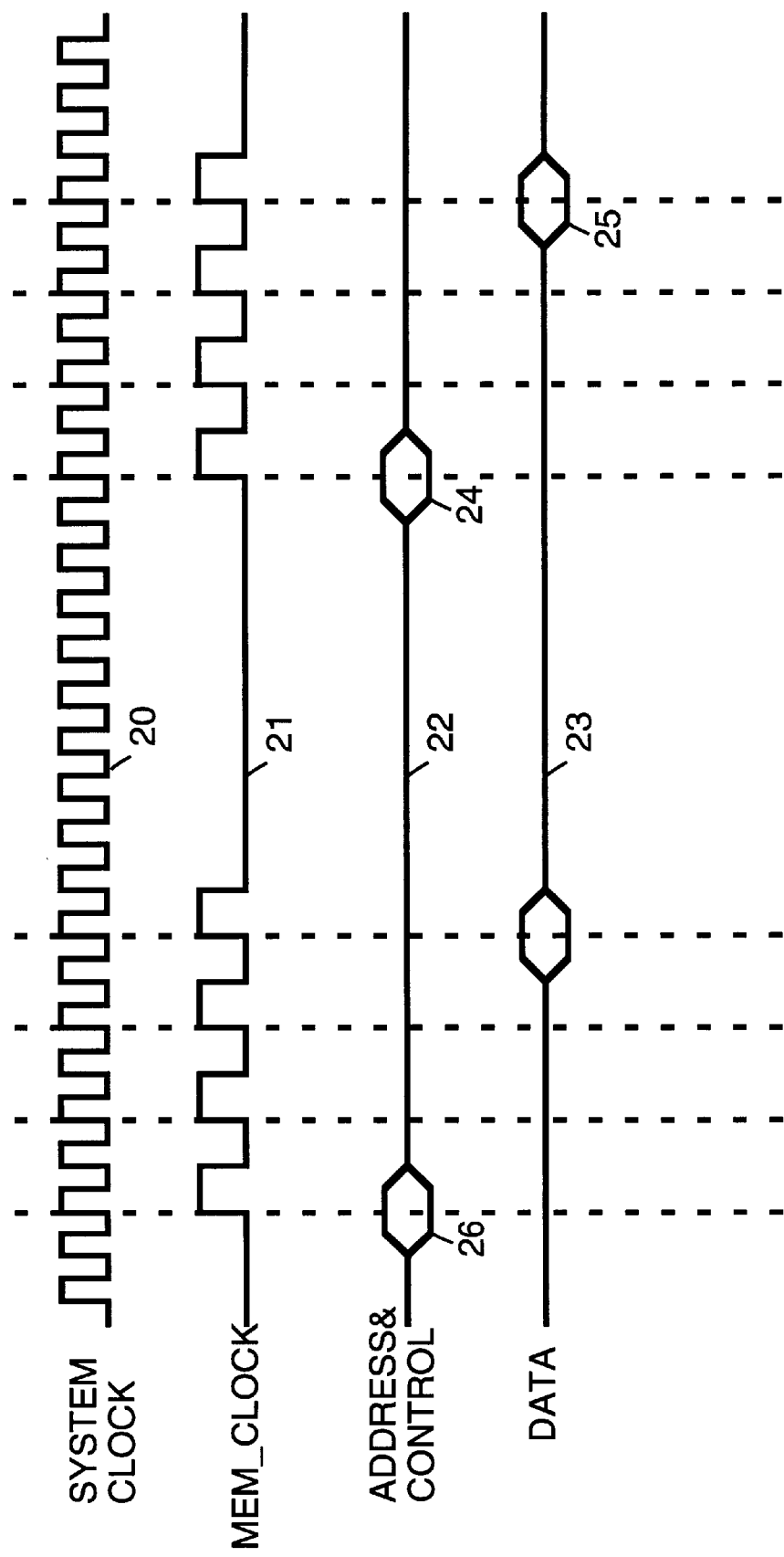
FIG. 2 shows a simplified timing diagram which illustrates operation of the memory controller and the synchronous memory shown in FIG. 1 in accordance with a preferred embodiment of the present invention.

FIG. 2 shows a simplified timing diagram which illustrates operation of the memory controller and the synchronous memory shown in FIG. 1 in accordance with a preferred embodiment of the present invention. FIG. 2 shows the relative timing of a clock (MEM_CLOCK) signal 21 placed by memory controller 11 on a clock (MEM_CLOCK) line 13, address and control signals 22 placed by memory controller 11 on address lines 14 and control lines 15, data signals 23 placed on data lines 16 and a system clock 20 placed on a system clock line 17.

As can be seen from FIG. 2, clock signal 21 on clock line 13, is idle until a data transaction begins, as evidenced in FIG. 2 by values for address and control signals 22 being placed on address lines 14 and control lines 15. Clock signal 21 on clock line 13 continues active until data signals 23 are transferred over data lines 16. Once data signals 23 are transferred over data lines 16, clock signal 21 on clock line 13 becomes idle. Clock signal 21 on clock line 13 remains idle until another data transaction begins.

When clock signal 21 on clock line 13 is idle, clock signal 21 is held steady at a logic 0 level or alternatively is held at a logic 1 level.

This intermittent operation of clock signal 21 on clock line 13 has several advantages. The clock driving circuitry within memory controller 11 will not consume as much power during the interim period between data transactions when clock signal 21 is not oscillating. Likewise, synchronous memory 12 will not consume as much power during the interim period between data transactions when clock signal 21 is not oscillating.

Another advantage of intermittent operation of clock signal 21 on clock line 13 is that there is no latency between the beginning of a data transaction and clock signal 21. Further, clock signal 21 can be synchronized to the data transaction. That is, once a data transaction is ready to begin, clock signal 21 can immediately be activated. This is different than a system which uses a free running clock, where it is necessary to delay data transactions a sufficient amount to be in synchronization with the free running clock. For a free running clock, the average time that a transaction needs to wait in order to synchronize with the free running clock is proportional to the ratio of the memory bus clock period to the memory controller clock period. For example, in FIG. 2, if MEM_CLOCK on clock line 13 were free running, then address 24 of address and control signals 22 would have been delayed a cycle of system clock 20, if the interval (as measured by the number of system clock cycles) between address 24 and address 26 is not a multiple of two. If address 24 were delayed, data 25 of data signals 23 would also have been delayed a cycle of system clock 20. This delay from a free running clock is necessary since the interval of the first address and the second address needs to be a multiple of two.

Figure 3:
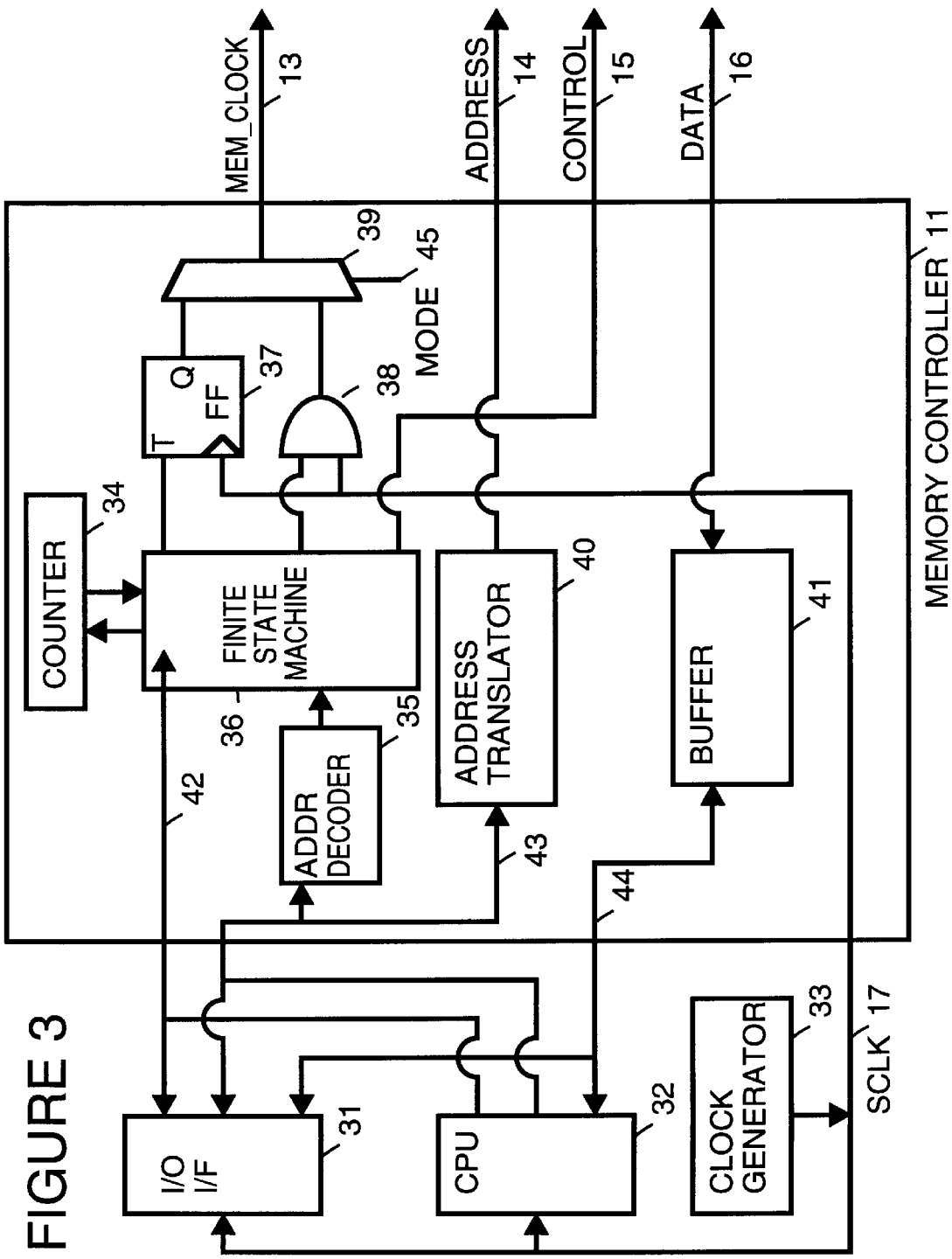
FIG. 3 is a simplified block diagram of the memory controller shown in FIG. 1 in accordance with a preferred embodiment of the present invention.

FIG. 3 is a simplified block diagram of memory controller 11. In addition to memory controller 11, FIG. 3 shows an input/output (I/O) interface 31, a central processing unit (CPU) 32 and a clock generator 33. CPU 32 makes read and write requests to synchronous memory 12 (shown in FIG. 1). While FIG. 3 shows only a single CPU 32, other CPUs, input/output (I/O) interfaces and memory controllers may be included in the system. Likewise, memory controller 11 may be used to control other memories in addition to synchronous memory 12.

I/O interface 31 makes memory requests, in the same way as does CPU 32, when direct memory access (DMA) is being used.

Clock generator 33 generates a square wave which functions as a periodic timing reference clock which is distributed as a system clock (SCLK) on a system clock line 17. The periodic timing reference clock is, for example, free running, that is, the periodic square wave continues without interruption as long as power is applied to the system.

Memory controller 11 receives transactions (read or write) from CPU 32 and I/O interface 31 and immediately attempts to issue the transaction to synchronous memory 12 (shown in FIG. 1).

Memory controller 11 is shown to include an address decoder 35, a finite state machine (FSM) 36, a counter 34, a toggle (T) flip-flop (FF) 37, a logic AND gate 38, a multiplexor 39, an address translator 40, and a buffer 41. Memory controller 11 additionally includes other logic blocks not germane to an explanation of the present invention.

Address decoder 35 determines whether a particular address received from I/O interface 31 or CPU 32 on an address bus 43 is for memory controller 11, and if so, for which memory which is controlled by memory controller 11.

Address translator 40, translates addresses on address bus 43 to individual bank, row, and column addresses which are placed on address lines 14 when accessing synchronous memory 12 (shown in FIG. 1).

A buffer 41 is used to hold read and write data which is transferred between a data bus 44 and data lines 16.

Finite state machine 36 controls the generation of clock signal 21 (shown in FIG. 2) placed on clock line 13 and control signals placed on control lines 15. Finite state machine 36 starts and stops generation of clock signal 21 corresponding to data transactions performed with synchronous memory 12, as more fully described below.

Counter 34 is a synchronous binary up counter. When counter 34 reaches its maximum value, counter 34 stops counting and holds its output at the maximum value. At any time, counter 34 can be loaded with a new value by finite state machine 36 and counting will continue from the new value. Alternatively, counter 34 is a synchronous binary down counter. In this case, when counter 34 reaches its minimum value, counter 34 stops counting and holds its output at the minimum value.

Toggle (T) flip-flop (FF) 37, logic AND gate 38 and multiplexor 39 function together as clock gating logic which is configurable to allow the ratio of the frequency of system clock 20 on system clock line 17 to clock signal 21 placed on clock line 13 to be either 1:1 or 2:1. The ratio is selected using a mode input 45 of multiplexor 39.

When mode input 45 is used to select the 2:1 ratio, multiplexor 39 selects the output of flip-flop 37 to function as clock signal 21 placed on clock line 13. In order to generate clock signal 21 on clock line 13, FSM 36 keeps the logic 1 value on the T input of toggle flip-flop 37. In order to place clock signal 21 on clock line 13 in an idle state, FSM 36 keeps the logic 0 value on the T input of toggle flip-flop 37. Alternatively, toggle flip-flop 37 could be replaced with a delay (D) flip-flop. In this case, in order to generate clock signal 21 on clock line 13, FSM 36 alternates the value on the D input of the D flip-flop between logic 0 and logic 1. In order to place clock signal 21 on clock line 13 in an idle state, FSM 36 holds either the logic 0 value or the logic 1 value on the D input of the D flip-flop.

When mode input 45 is used to select the 1:1 ratio, in order to generate clock signal 21 on clock line 13, FSM 36 keeps a logic 1 value on an input of logic AND gate 38. In order to place clock signal 21 on clock line 13 in an idle state, FSM 36 keeps a logic 0 value on the input of logic AND gate 38.

Figure 4:
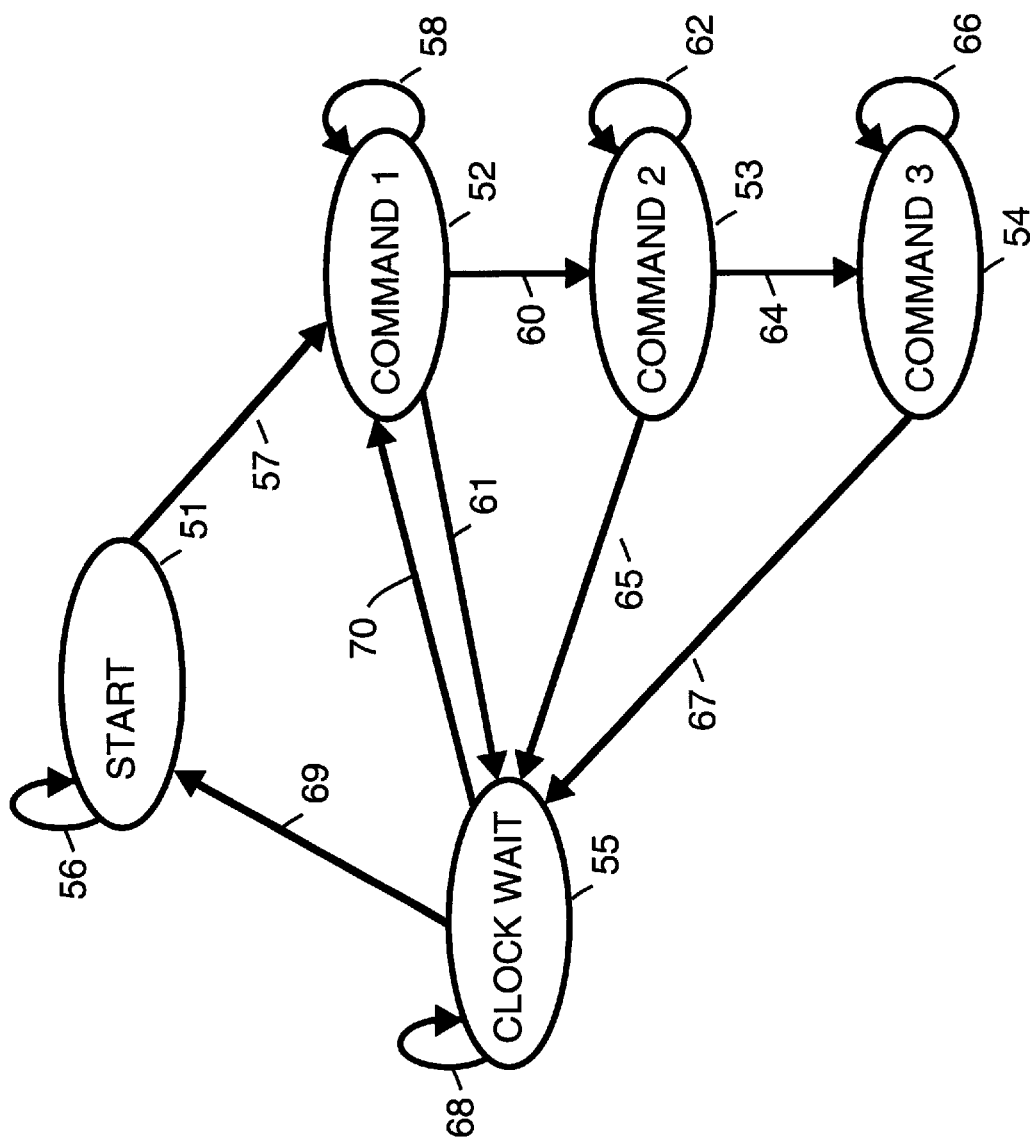
FIG. 4 shows a state diagram for a state machine within the memory controller shown in FIG. 1 in accordance with a preferred embodiment of the present invention.

FIG. 4 is a state transition diagram for FSM 36, shown in FIG. 3. Upon system reset, FSM 36 enters a start state 51. As indicated by an arrow 56, while idle, FSM 36 remains in start state 51. In start state 51, FSM 36 holds the T input of T flip-flop 37 (shown in FIG. 3) and the input of logic AND gate 38 (shown in FIG. 3) at logic 0.

When memory controller 11 (shown in FIG. 3) receives a transaction and the information decoded by address decoder 35 (shown in FIG. 3) indicates a valid memory address within synchronous memory 12 (shown in FIG. 1), FSM 36 enters a command 1 state 52, as indicated by an arrow 57.

In command 1 state 52, FSM 36 issues a command to synchronous memory 12 using control lines 15 and address lines 14. FSM 36 also activates clock signal 21 on clock line 13 by holding the T input of T flip-flop 37 (shown in FIG. 3) and the input of logic AND gate 38 (shown in FIG. 3) at logic 1. Also FSM 36 loads a new count value into counter 34 (shown in FIG. 3). The new count value will depend upon how many system clock cycles the command requires to complete. For example, if the command requires eight cycles, the counter would be loaded with a count value eight less than the maximum count value.

FSM 36 remains in command 1 state 52, as indicated by an arrow 58, until the first command has completed. If the transaction requires only one command to be completed, after completing the first command, FSM 36 enters a clock wait state 55, as indicated by an arrow 61. In clock wait state 55, FSM 36 waits for counter 34 to finish counting to the maximum value. If there is no other transaction waiting, when counter 34 reaches the maximum value, FSM 36 will return to start state 51, as indicated by an arrow 69. As discussed above, in start state 51, FSM 36 holds the T input of T flip-flop 37 (shown in FIG. 3) and the input of logic AND gate 38 (shown in FIG. 3) at logic 0, thus idling clock signal 21 on clock line 13. FSM 36 remains in start state 51 until memory controller 11 (shown in FIG. 3) receives a transaction and the information decoded by address decoder 35 (shown in FIG. 3) indicates a valid memory address within synchronous memory 12 (shown in FIG. 1).

In clock wait state 55, when there is another transaction waiting, FSM 36 will return to command 1 state 52, as indicated by an arrow 70 and counter 34 will be reloaded with a new count value. In this case the clock will continue to run and will not be stopped.

If a transaction requires more than one command to be completed, after completing the first command in command 1 state 52, FSM 36 enters a command 2 state 53, as indicated by an arrow 60 and loads counter 34 with a new value. In command 2 state 53, FSM 36 issues a command to synchronous memory 12 using control lines 15. FSM 36 remains in command 2 state 53, as indicated by an arrow 62, until the second command has completed. If the transaction requires only two commands to be completed, after completing the second command, FSM 36 enters clock wait state 55, as indicated by an arrow 65.

If a transaction requires more than two commands to be completed, after completing the second command in command 2 state 53, FSM 36 enters a command 3 state 54, as indicated by an arrow 64 and loads counter 34 with a new value. In command 3 state 54, FSM 36 issues a command to synchronous memory 12 using control lines 15. FSM 36 remains in command 3 state 54, as indicated by an arrow 66, until the third command has completed. After completing the third command, FSM 36 enters clock wait state 55, as indicated by an arrow 67.

Also, FSM 36 will include other states normally needed for DRAM or SRAM subsystems including an initialization sequence and, for DRAM subsystems, a sequence for generating memory refresh commands. In the case of refresh, the clocks will start and stop just as if a transaction had been started on bus 43.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for providing an external clock signal to an external clock input of a synchronous memory comprising the following steps:
    (a) holding the external clock signal in an idle state;
    (b) upon start of a transaction with the synchronous memory, activating the external clock signal, the clock signal when active functioning as a periodic timing reference clock;
    (c) keeping the external clock signal active during the transaction; and,
    (d) upon completion of the transaction, returning the external clock signal to the idle state.

2. A method as in claim 1 wherein
    step (b) includes the following substep:
        (b.1) loading a new count in a counter;
    step (c) includes the following substep:
        (c.1) beginning with the new count, regularly incrementing the counter; and,
    step (d) includes the following substep:
        (d.1) upon the counter reaching a maximum value, returning the clock signal to the idle state.

3. A method as in claim 1 wherein
    step (b) includes the following substep:
        (b.1) loading a new count in a counter;
    step (c) includes the following substep:
        (c.1) beginning with the new count, regularly decrementing the counter; and,
    step (d) includes the following substep:
        (d.1) upon the counter reaching a minimum value, returning the clock signal to the idle state.

4. A method as in claim 1 additionally comprising the following steps: (e) upon start of a second transaction with the synchronous memory, again activating the external clock signal;
    (f) keeping the clock signal active during the second transaction; and,
    (g) upon completion of the second transaction, returning the external clock signal to the idle state.

5. A method as in claim 1 wherein timing of transitions between steps (a), (b), (c) and (d) is controlled by a finite state machine.

6. A method as in claim 1 wherein in step (d) when there is another transaction pending, the external clock signal does not return to the idle state.

7. A method for providing a external clock signal to an external clock input of a synchronous memory providing the following steps:
    (a) holding the external clock signal in an idle state;
    (b) upon forwarding of control and address signals for a transaction with the synchronous memory, activating the external clock signal, the external clock signal when active functioning as a periodic timing reference clock;
    (c) keeping the external clock signal active during the transaction; and,
    (d) upon successful transfer of data over data lines connected to the synchronous memory, returning the external clock signal to the idle state.

8. A method as in claim 7 wherein step (b) includes the following substep:
(b.1) loading a new count in a counter;

step (c) includes the following substep:
(c.1) beginning with the new count, regularly incrementing the counter; and, step (d) includes the following substep:
(d.1) upon the counter reaching a maximum value, returning the clock signal to the idle state.

9. A method as in claim 7 wherein step (b) includes the following substep:
(b.1) loading a new count in a counter;

step (c) includes the following substep:
(c.1) beginning with the new count, regularly decrementing the counter; and, step (d) includes the following substep:
(d.1) upon the counter reaching a minimum value, returning the clock signal to the idle state.

10. A method as in claim 7 additionally comprising the following steps:
(e) upon forwarding of control and address signals for a second transaction with the synchronous memory, again activating the external clock signal;
(f) keeping the external clock signal active during the second transaction; and,
(g) upon successful transfer of data over data lines connected to the synchronous memory, returning the external clock signal to the idle state.

11. A method as in claim 7 wherein timing of transitions between steps (a), (b), (c) and (d) is controlled by a finite state machine.

12. A memory controller comprising:

a clock output, the clock output being for providing an external clock signal to an external clock input of a synchronous memory; and, logic circuitry, coupled to the clock output, the logic circuitry providing the external clock to the clock output upon start of a data transaction with the synchronous memory, the external clock signal, when active, functioning as a periodic timing reference clock;

wherein the logic circuitry causes the external clock signal to be idle at the clock output upon completion of the data transaction with the synchronous memory.

13. A memory controller as in claim 12 wherein, the logic circuitry includes:

gating means for gating a system clock signal; and, control means for controlling the gating means.

14. A memory controller as in claim 12 wherein the gating means comprises a flip-flop.

15. A memory controller as in claim 12 wherein the gating means comprises a logic AND gate.

16. A memory controller as in claim 12 wherein the control means comprises a finite state machine.

17. A memory controller as in claim 16 wherein the control means additionally comprises a counter.

* * * * *